(12) United States Patent
Reeder, III

(10) Patent No.: US 9,575,091 B2
(45) Date of Patent: Feb. 21, 2017

(54) TESTING DEVICE FOR ELECTRICAL SAFETY USING WIRELESS COMMUNICATION

(71) Applicant: Kenneth Mark Reeder, III, Norristown, PA (US)

(72) Inventor: Kenneth Mark Reeder, III, Norristown, PA (US)

( * ) Notice: Subject to any disclaimer, the term of this patent is extended or adjusted under 35 U.S.C. 154(b) by 212 days.

(21) Appl. No.: 14/217,362

(22) Filed: Mar. 17, 2014

(65) Prior Publication Data

US 2014/0266287 A1    Sep. 18, 2014

Related U.S. Application Data

(60) Provisional application No. 61/753,745, filed on Mar. 15, 2013.

(51) Int. Cl.
| | | |
|---|---|---|
| G01R 31/04 | (2006.01) | |
| G01R 1/04 | (2006.01) | |
| G01R 1/22 | (2006.01) | |
| G01R 31/44 | (2006.01) | |

(52) U.S. Cl.
CPC ............... *G01R 1/0408* (2013.01); *G01R 1/22* (2013.01); *G01R 31/44* (2013.01)

(58) Field of Classification Search
None
See application file for complete search history.

(56) References Cited

U.S. PATENT DOCUMENTS

| | | | | |
|---|---|---|---|---|
| 3,836,844 A | * | 9/1974 | Prugh | G01R 31/041 324/133 |
| 5,136,237 A | * | 8/1992 | Smith | G01R 1/06772 324/149 |
| 6,323,652 B1 | * | 11/2001 | Collier | G01R 31/04 324/508 |
| 6,710,546 B2 | * | 3/2004 | Crenshaw | H02J 9/02 315/150 |
| 6,785,805 B1 | * | 8/2004 | House | G06Q 10/087 700/90 |
| 7,018,800 B2 | * | 3/2006 | Huisenga | G01R 19/2509 324/750.3 |
| 7,057,401 B2 | * | 6/2006 | Blades | G01R 31/041 324/424 |
| 7,259,567 B2 | * | 8/2007 | Sears | G01R 31/045 324/508 |
| 7,341,193 B2 | * | 3/2008 | Iasso | G01R 1/0408 235/451 |
| 7,385,406 B1 | * | 6/2008 | Blades | G01R 31/041 324/424 |
| 7,605,594 B2 | * | 10/2009 | Blades | G01R 31/041 324/424 |
| 8,781,633 B2 | * | 7/2014 | Fata | G05B 15/02 700/276 |

(Continued)

*Primary Examiner* — Jermele M Hollington
*Assistant Examiner* — Suresh K Rajaputra
(74) *Attorney, Agent, or Firm* — Pinnacle IP Strategies, LLC; Scott E. Scioli

(57) ABSTRACT

Devices and methods for enhancing electrical safety are provided herein. Devices testing the safety of light fixtures are provided. Also provided are a variety of testing tools for improving electrical safety. The devices are generally capable of wirelessly communicating with a computer, particularly a hand-held device such as a smart-phone or tablet. Methods for using the devices are also provided.

19 Claims, 6 Drawing Sheets

(56) References Cited

U.S. PATENT DOCUMENTS

| | | | | |
|---|---|---|---|---|
| 8,947,096 B1* | 2/2015 | Wolf | ................... | B60Q 11/00 |
| | | | | 324/414 |
| 2002/0140360 A1* | 10/2002 | Crenshaw | ................ | H02J 9/02 |
| | | | | 315/149 |
| 2005/0212526 A1* | 9/2005 | Blades | ................ | G01R 31/041 |
| | | | | 324/543 |
| 2008/0204034 A1* | 8/2008 | Blades | ................ | G01R 31/041 |
| | | | | 324/522 |
| 2009/0212964 A1* | 8/2009 | Hibma | ............ | G01R 19/16547 |
| | | | | 340/657 |
| 2012/0245880 A1* | 9/2012 | Nabrotzky | ........... | G01R 31/086 |
| | | | | 702/122 |
| 2012/0268136 A1* | 10/2012 | Lee | ..................... | G01R 31/04 |
| | | | | 324/508 |
| 2013/0342216 A1* | 12/2013 | Orr | ................. | H01L 31/02021 |
| | | | | 324/538 |
| 2015/0120246 A1* | 4/2015 | Shrubsole | ............. | G01R 31/44 |
| | | | | 702/182 |

\* cited by examiner

TESTING DEVICE FOR ELECTRICAL SAFETY USING WIRELESS COMMUNICATION

CROSS-REFERENCE TO RELATED APPLICATIONS

This claims benefit of U.S. Provisional Patent Application No. 61/753,745, filed Mar. 15, 2013, the entirety of which is incorporated herein by reference.

BACKGROUND

Field of the Invention

This relates generally to devices for enhancing electrical safety. More specifically it relates to testing electrical safety with devices and methods that can wirelessly communicate with a computer.

Description of Related Art

The electrical industry today is far more advanced than when electricity was made widely available during the 1920's. Newer construction is protected by both national and state electrical codes, and licensing procedures. Code inspections make the industry much safer than in prior generations. Certification bodies, such as Underwriter's Laboratories, test equipment and device for electrical safety and list electrical equipment that has met industry standards.

Nevertheless, faulty or defective electrical wiring, overloaded circuits, and improper fail-safes continue to pose substantial hazards. For example, the U.S. Fire Administration ("USFA") estimates that electrical problems account for more than 26,000 residential electrical fires each year in the US alone. Many of those electrical fires can be traced to old or improper wiring, receptacles, switches, light fixtures, and extension and appliance cords placed under rugs or high traffic areas, poor maintenance and overloaded circuits. Over half of such fires are attributed to wiring problems. The damage to property (e.g. from fire, loss of use, and even water damage from triggered sprinklers) amounts to billions of dollars yearly, while the harm to people (e.g. shocks, burns, electrocution) is incalculable. USFA estimates almost 300 deaths and over 1000 fire-related injuries occur each year as result of these fires.

It is also compelling to note that compared to fires that have a nonelectrical cause, residential fires caused by electrical problems are actually much worse in terms of both injuries and property loss. The dollar losses for electrical fires are more than double those for nonelectrical fires. Deaths are almost 70% increased in electrical fires.

There are many groups and individuals concerned with improving electrical safety, including code-setting bodies, code-enforcing bodies, licensing bodies, testing and certifying bodies, code-enforcement officials, electrical contractors and engineers, licensed electricians, home inspectors, first responders (e.g. firefighters), insurers, property owners, and residents. Currently there is much communication and cooperation between many of these groups, however, often the property owners and/or residents do not play an active role in electrical safety.

Many electrical fires/deaths could be prevented by providing homeowners with basic education on electrical theory, and instruction on maintenance and repair. Basic concepts and practical (applied) electrical terms such as 'open ground', 'open neutral', 'open hot', 'reverse polarity' are not well understood. Moreover, it is difficult to convince many homeowners or residents of the importance of checking for problems and monitoring for electrical safety issues. The situation is quite similar with commercial property owners and tenants.

In addition, one of the keys to electrical safety is testing equipment or tools. Many tools for electrical testing exist in today's market, such as tools to determine if wiring is correct, receptacle testers, contact and non-contact voltage detectors, continuity testers and multimeters or the like. Unfortunately, while the tools have gotten easier to use in some cases, they can still be very difficult to understand or interpret even for the skilled professional. At the very least the homeowner would ideally have tools for testing wiring, circuits, receptacles and outlets, lighting fixtures, power cords, switches, and charging cords, adapters, and devices for electronics gadgets.

There is an ongoing need for devices and systems that can improve electrical safety.

SUMMARY

This disclosure provides improved electrical testing tools that communicate with smart phones, portable computers, or computers at a remote location, and related methods and systems. The information obtained by the testing tool can be directly processed by the computer which can provide detailed instructions or direction to the user, or alternatively, the information can be transmitted e.g. by a homeowner, tenant, amateur, do-it-yourselfer (DIYer) or a handyman directly to a professional licensed electrician who can further analyze the information and assess any potential problems. Because such devices and methods allow monitoring of electrical safety and reduce the likelihood of fire or injury, in return for periodic regular use of such devices or methods, homeowners could receive discounts on hazard insurance policies (e.g. homeowners and/or fire) be rewarded with e.g. insurance discounts, as is done with home security systems.

Also disclosed herein are methods and systems that provide users, such as homeowners, with electrical testing tools that wirelessly transmit diagnoses to a smart phone, portable computer, or other computer. The computer can assist the user with electrical diagnoses, as well as by providing step-by-step repair instructions for DIYers, live support or help from a professional, or access to a pool of available and/or recommended licensed or certified contractors.

It is another object of this disclosure to provide electrical testing tools or devices adapted for testing a variety of different lighting fixtures used in homes or commercial settings.

It is thus an object of this disclosure to provide electrical testing tools or devices that can communicate wirelessly with smart phones, portable computers, remote computers or the like to record, store, document, and/or analyze the results of testing with the tools.

It is also an object of this disclosure to provide methods and systems for improving electrical safety by providing electrical testing tools which when used regularly allow electrical problems to be diagnosed and remedied.

It is a further object of the disclosure to provide methods and systems for promoting electrical safety whereby DIYers can obtain proper, current, step-by-step instructions for diagnosing and/or correcting electrical problems such as faults, shorts, defective receptacles and fixtures to be detected, and inadequate, weakened, damaged, or aged wiring, through the use of electrical testing tools that communicate wirelessly with a smart phone, portable computer, or remote computer.

It is a further object of the disclosure to provide methods and systems for reducing financial risks associated with electrical safety whereby insurance providers can incentivize property owners to increase electrical safety through the regular use of an electrical testing device tool that can report electrical problems or faults wirelessly to a smart phone, portable computer, or remote location.

In a first aspect the disclosure provides electrical testing tools for testing light fixtures. The testing tools generally comprise a body having attached thereto and being in electrical connection with a tester extension adapted for testing the electrical safety of at least one light fixture. The tester tools also have at least one ground wire in electrical connection with the body and adapted for connecting to a suitable external ground source. The tools further comprise one or more selectors for selecting one or testing functions, and an internal power source for powering at least the tool. The testing extension generally has nonconductive structure complementary to the light fixture so that it can be positioned therein for testing the fixture, and a conductive contact positioned for establishing electrical contact with the light fixture. The tools preferably have circuitry for wireless communication with a computer, such as a hand-held computer. The wireless communication can also be powered by the internal power source.

In a second aspect, provided are devices for generally enhancing electrical safety. The devices comprise a testing tool for testing an electrical component, and have circuitry for wireless communication, an antenna for facilitating or improving wireless communication with at least one computer, an internal power source for powering at least the tool and the wireless communication, one or more selectors for selecting one or testing functions, one or more of a display screen, an audio output, and at least one indicator light. The testing tools may optionally be adapted to receive one or more ground wires for attaching to a grounded object during electrical testing, or one or more other wires useful during other electrical testing. The devices can wirelessly communicate with a computer, preferably a hand-held computer that is, e.g. a smartphone, smart watch, PDA, tablet computer, or the like.

In another aspect, this disclosure provides methods of enhancing electrical safety comprising the steps of:
a) providing an electrical testing tool capable of wirelessly communicating with a computer, said tool comprising
  i) a tool for testing light fixtures as disclosed herein; or
  ii) a device for enhancing electrical safety as disclosed herein;
b) using the electrical testing tool to test one or more electrical components one or more times;
c) sending the test results wirelessly to a computer;
d) analyzing the test results for one or more electrical safety issues; and
e) taking preventive or corrective action based on the analysis to resolve or mitigate any electrical safety issues.

In yet another aspect, methods are provided for reducing financial risks associated with electrical safety for an insurer comprising the steps of:
providing an incentive to an insured for using at an insured property, for a specified period on a specified frequency, an electrical testing tool comprising wireless communication circuitry for reporting electrical problems or faults wirelessly to a computer;
receiving and collecting data from the use of the electrical testing tool by the insured during the specified period wherein the receiving and collecting are done using a computer in communication directly or indirectly with the electrical testing tool;
analyzing the collected data for one or more electrical safety issues for the insured property; and
taking preventive or corrective action based on the analysis to resolve or mitigate the electrical safety issue.

The methods can also include the step of correlating a total amount of financial loss to the one or more electrical safety issues.

In still another aspect, disclosed are methods of providing a marketing or advertising message related to electrical safety. The methods generally comprise the steps of:
preparing an advertisement directly or indirectly related to electrical safety; and
placing the advertisement for display or delivery to an audience in connection with a computer program or application used with an electrical testing tool comprising wireless communication circuitry for reporting electrical problems or faults wirelessly to a computer.

These and/or further aspects, features, and advantages of the present invention will become apparent to those skilled in the art in view of this disclosure.

BRIEF DESCRIPTION OF THE DRAWINGS

FIG. 4 shows an illustrative embodiment of a modular testing tool for electrical systems with a testing module for receptacles installed. The device as shown is being as a circuit breaker finder. The testing tool communicates wirelessly with the handheld computer device. When the correct circuit breaker is shutoff, power to the receptacle is off, and the testing tool communicates and confirms that the circuit breaker is off via the hand-held computer or tablet. The device as shown can be used to test receptacles of any type or configuration. Other modules allow testing of light fixtures, wiring, voltage, conductance or the like.

DETAILED DESCRIPTION

Figure 1:
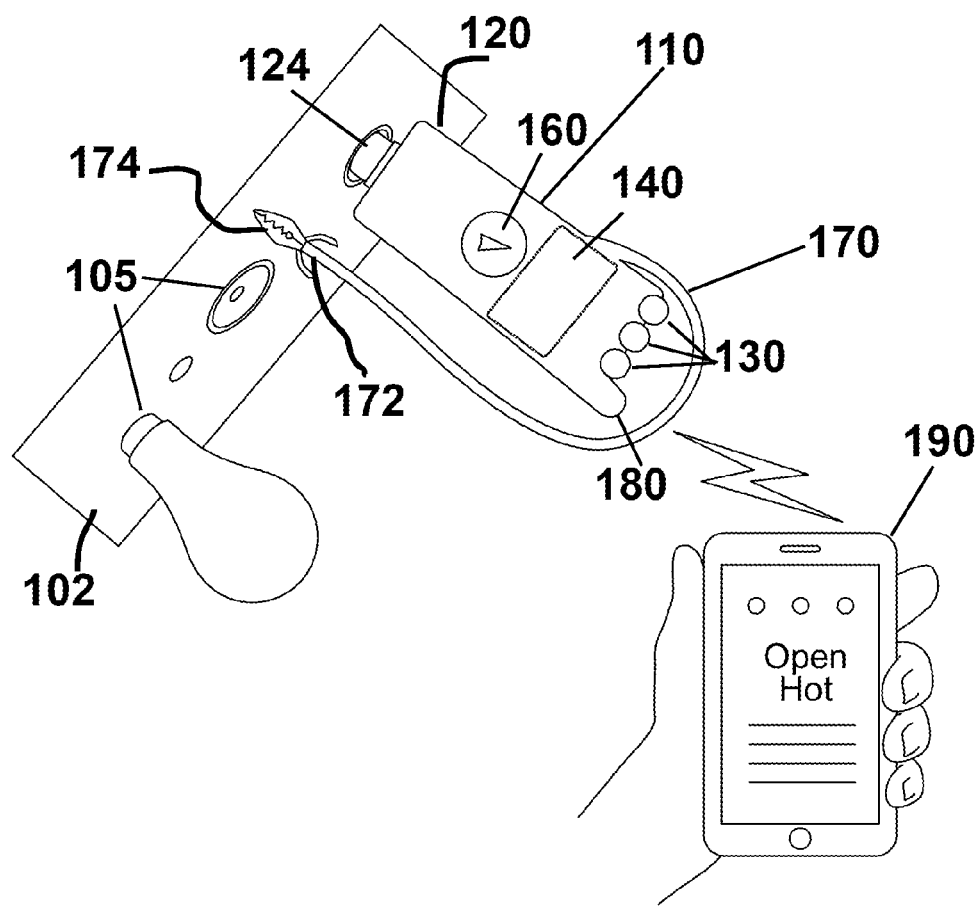
FIG. 1 shows an embodiment of a modular testing tool for electrical systems with a testing module for light fixtures installed. The device is shown positioned for testing a socket in a lighting fixture and communicating with a hand-held/portable computer or tablet.

Tools, methods, and systems for enhancing electrical safety are disclosed herein. The tools are useful in residential or commercial settings. The tools can be used to affirm electrical systems are operating safely or they can be used in diagnosing, locating, or repairing a plurality of electrical problems such as faults, shorts, defective receptacles and fixtures, and inadequate, weakened, damaged, or aged wiring.

The inventors have discovered methods of enhancing electrical safety by utilizing a 'smart' tool for electrical safety, and providing communication between the testing tool with a portable or other computer. Surprisingly, this provides the user of the tool with numerous options that enhance safety that were heretofore unavailable such as receiving step-by-step instructions for verifying an electrical component is operating correctly, or for diagnosing or repairing an electrical problem. Further the user may obtain professional assistance or even determine parts needed or order them directly. Thus, the inventors have discovered a convenient method of enhancing electrical safety and simultaneously providing other desirable benefits.

ABBREVIATIONS

The following abbreviations apply unless indicated otherwise:
AC: alternating current;
AED: automatic external defibrillator;
AFCL AFI: arc fault circuit interrupter;
app: computer application or program;
CFL: compact fluorescent lamp;
DC: direct current;
GFI, GFIC: ground fault interrupt circuit;
GSM: Global System for Mobile Communications
HID: high-intensity discharge;
HSPA: high speed packet access;
IEEE: Institute of Electrical and Electronic Engineers;
LAN: local area network;
LED: light-emitting diode;
LTE: long-term evolution;
MR: mini-reflector;
PAR: parabolic reflector;
RCCT: robust clustering with cooperative transmission;
SMS: short message service;
TD-SCDMA: time division synchronous code division multiple access;
WAN: wide area network;
WiFi: wireless fidelity;
WiMax: Worldwide Interoperability for Microwave Access;
WISP: Wireless internet service provider;
WLAN: wireless local access network; and
WRAN: wireless regional access network.

DEFINITIONS & ABBREVIATIONS

Unless expressly defined otherwise, all technical and scientific terms, terms of art, and acronyms used herein have the meanings commonly understood by one of ordinary skill in the art in the field(s) of the invention, or in the field(s) where the term is used. In accordance with this description, the following abbreviations and definitions apply.

As used herein a "testing tool" for means a device for testing electrical systems, circuits, wiring, outlets, receptacles, fixtures (including lighting fixtures), cords, extensions, appliances and the like. 'Tester' and 'testing device' are used synonymously with 'testing tool.'

As used herein a "modular" testing tool has one or more (e.g. a plurality) of different modular extensions or components (i.e. "modules") that may be attached to the tool to add to or alter the functionality of a base device or tool. For examples, modular components can be attached to a base tool to provide for testing light fixtures, receptacles, circuits, or for identifying proper circuit breakers or the like. The modular components may attach to the base by any useful means known, such as by screwing in, quick release mechanisms, or connections that slidingly engage the base. Magnetic connections, electrical harnesses, straps, clasps, buckles or the like may also be used to connect a particular module to the base device. Connecting the module to the base device requires adequate attachment for mechanical stability during use, and to make appropriate or required electrical connections between the base tool and the module. Connections may also be made whereby the module is free or at least substantially free from the base device provided that sufficient electrical communication is maintained with the base tool.

As used herein "light bulb" or bulb" means any type of light source including incandescent bulbs [such as general service bulbs (general, globe, or decorative styles), reflectorized bulbs (such as reflector and parabolic reflector styles), tungsten-halogen bulbs (such as line voltage (e.g. PAR 16, 20, 30, and 38 reflectorized bulbs, T-3 double-ended bulbs, and T-4 single-ended bulbs) or low voltage (such as mini-reflector MR8, MR11, and MR16 bulbs, PAR36 bulbs, and T4-Bi-Pin miniature bulbs)), and xenon bulbs]; fluorescent bulbs (e.g. fluorescents, compact fluorescents, and T8 bulbs), high-intensity discharge (HID) bulbs (e.g. metal halide, low pressure sodium, high pressure sodium, or mercury vapor bulbs), and light emitting diodes (LEDs). It is to be understood that different types of light bulbs may have different bases and/or connectors and that a light fixture may require a particular size and type of bulb.

A "computer" as used herein includes any computing device. Preferred for some embodiments are hand-held computer devices such as smart phones, PDAs, or tablet computers. Smart watches (and other wrist devices/PDAs/computers) and other wearable computer devices are also contemplated for use herein. Other computers suitable for certain uses herein include other portable computers, laptops, mountable computers, or even desktop computers. Preferred computers have wireless communication capabilities via one or more wireless protocols over one or more wireless networks. In certain applications, more than one computer is used. For example, the electrical safety tool may communicate with a smart phone or tablet computer directly or indirectly over a network including various remote computers. Alternatively, the data communicated to and/or from a smart phone or other hand-held device may subsequently be sent to or stored on a further computer via wireless communication or through a wired "synching" process. In certain embodiments, an app is used on a hand-held device, which subsequently stores and receives or retrieves data (e.g. electrical safety data, testing results, step-by-step help or instructions, e-commerce data, or advertisements) from a database on a remote computer such as a server.

As used herein, "wireless communication" means transmission of data that generally can be over any air interface or suitable wireless network (such as a LAN, WAN, WLAN, WRAN, or other private or public network) including the Internet (using e.g. a WISP). Wireless communication for purposes herein may include communication of any information or data from a testing device or tool to a computer or vice-versa. There may be intermediary communications that are wired or which involve other computers on a network, including remote computers. Wireless communication may be via any one or more communication protocols now known or hereafter developed that are suitable for wireless communication. Examples of such protocols include Bluetooth protocols, IEEE 802.xx standard protocols (e.g. 802.11, 802.15, 802.16, etc.), WiFi, WiMax, Whitefi, RCCT, GSM, and many others, or any combinations thereof. Preferred protocols are low-energy requiring protocols to provide for longer battery life where the tool is battery-powered. Cellular communication protocols and/or networks (e.g. 3G, 4G, LTE, and/or Edge) may also be employed in various embodiments. Other examples of methodology or networks useful herein include UMT, HSPA, HSPA+, and TD-SCMDA. Wireless communication can also include email, SMS (and other forms of 'texting'), email-to-text, text-to-email, and other forms of messaging. Moreover, "circuitry" for wireless communication as used herein includes any form of circuitry, micro-circuitry, processors, microprocessor or the like. Examples of microprocessors for wireless communication include various chips for WiFi, cellular, or other wireless technology, such as wireless or mobile processors or chip or chip sets enabled for wireless communication. Manufacturers of such processors include Intel, Broadcomm, Qualcom, Ralink, Asix and numerous others. Other vendors such as Altair, Leadcore, Marvell, Nvidia (Icera), Renesas, Sequans, Spreadtrum, and ST-Ericsson also provide chips and related technology that may be useful herein.

As used herein, the singular form of a word includes the plural, and vice versa, unless the context clearly dictates otherwise. Thus, the references "a", "an", and "the" are generally inclusive of the plurals of the respective terms. For example, reference to "a module" or "an electrical circuit" includes a plurality of such "modules" or "circuits."

The words "comprise", "comprises", and "comprising" are to be interpreted inclusively rather than exclusively. Likewise the terms "include", "including" and "or" should all be construed to be inclusive, unless such a construction is clearly prohibited from the context. Further, forms of the terms "comprising" or "including" are intended to include embodiments encompassed by the phrases "consisting essentially of" and "consisting of". Similarly, the phrase "consisting essentially of" is intended to include embodiments encompassed by the phrase "consisting of".

Where used herein, ranges are provided in shorthand, so as to avoid having to list and describe each and every value within the range. Any appropriate value within the range can be selected, where appropriate, as the upper value, lower value, or the terminus of the range.

The process steps, method steps, algorithms or the like may be described in a sequential order, however such processes, methods and algorithms may be configured to work in alternate orders. In other words, any sequence or order of steps that may be described does not necessarily proscribe a requirement that the steps be performed in that order. The steps of processes described herein may be performed in any order practical or useful. Further, some steps may be performed simultaneously, in parallel, or concurrently.

The methods and devices and/or other advances disclosed here are not limited to particular methodology, protocols, and/or structures described herein because, as the skilled artisan will appreciate, they may vary. Further, the terminology used herein is for the purpose of describing particular embodiments only, and is not intended to, and does not, limit the scope of that which is disclosed or claimed.

Although other devices, systems, methods, or other means or materials similar or equivalent to those described herein can be used in the practice of the present invention, the preferred devices, systems, methods, or other means or materials are described herein.

All patents, patent applications, publications, technical and/or scholarly articles, and other references cited or referred to herein are in their entirety incorporated herein by reference to the extent permitted under applicable law. Any discussion of those references is intended merely to summarize the assertions made therein. No admission is made that any such patents, patent applications, publications or references are prior art, or that any portion thereof is either relevant or material to the patentability of what is claimed herein. Applicant specifically reserves the right to challenge the accuracy and pertinence of any assertion that such patents, patent applications, publications, and other references are prior art, or are relevant, and/or material.

DETAILED DESCRIPTION OF ILLUSTRATIVE EMBODIMENTS

In a first of the several aspects of this disclosure, provided herein are testing tools for enhancing electrical safety of light fixtures. The tools generally comprise a base or body, one or more testing extensions useful for testing at least one lighting fixture, for example a residential or commercial light fixture.

The testing extension includes an end adapted to fit into a light fixture to test e.g., the proper wiring thereof, and may be configured in any of a variety of ways. As discussed below in depth, the embodiment depicted on FIG. 1 shows a testing extension 120 adapted with threads to screw into a light fixture 105. The distal end 124 features a conductive tip that provides an electrical contact with the light fixture 105. Various threaded and non-threaded configuration can be utilized on end 124 to accommodate a vast variety of residential and/or commercial lights. A grounding wire is preferably included in a convenient location to allow proper testing of the light fixture.

In some embodiments one or more indicator lights can indicate the status of the device or testing or results of the latest test. Preferably a plurality of lights are used wherein different patterns of 'on', 'off', or 'flashing' can indicate different information to the user regarding the electrical safety of the light fixture.

The devices comprise circuitry sufficient for wireless communication and preferably an antenna where useful. Any of a variety of functions can be tested using selector knobs, buttons, thumbwheels, switches, or even a touch-sensitive screen that provides menus choices. In one embodiment the device is voice-activated. Preferably, at least the results of the most recent test(s) can be conveyed to a computer wirelessly. Currently preferred computers are hand-held computer devices, such as a smart phone, tablet, or other portable computer. In some embodiments, the tool can communicate directly or indirectly to a remote computer.

Certain aspects of this disclosure may be better understood with reference to the figures. FIG. 1 depicts an embodiment of a testing tool or device 100 as disclosed herein for testing light fixtures for electrical safety. The tool 100 features a base or body 110 comprising the main electronic components (not shown) of the electrical testing tool and having attached thereto at least one light tester extension 120 adapted for testing the safety of an electrical light fixture and in electrical communication with the base.

Tester extension 120 as depicted protrudes from the base and features a plurality of neutral or nonconductive threads 122 complementary to and adapted to readily screw into a light fixture 102. The distal end of extension 120 includes an electrical contact (not shown).

As shown, the device 100 includes a plurality of optional indicator lights 130 (such as LEDs or other low-power light sources), as well as an optional display screen adapted to display information to increase the convenience of using of the device or to enhance the user experience (e.g. by displaying useful or instructive to the user thereof). Also shown in the embodiment depicted is selector 160 which in various embodiments may be present as one or more knobs, buttons, switches, or the like, or any combination thereof. A ground wire 170 is also attached and in electrical communication with the base 110 and/or the tester extension 120 as required. The ground wire 170 may be removable in various embodiments, or may be hardwired to the base or body 110. The distal end 172 of the ground wire 170 may feature an alligator clip 174 (as shown) or such other attachment(s) as may be useful for temporarily (but safely) securing/grounding the ground wire 170 during use or testing.

The device 100 is adapted for communicating wirelessly and has circuitry sufficient for wireless communication including antenna 180. As described above the devices described herein and through the specification may comprise one or more microprocessors or chipsets that can facilitate wireless communication. In some embodiments, the device 100 also features ports for wired connections or communications with a hand-held computer 190 (or other device(s)), such as USB, micro-USB, or other communication or data ports. In some embodiments communication with the computer (e.g. smart phone, etc) includes a program or app installed on the computer.

Tester extension 120 may be modular in nature. For example, the tester extension may plug into the base 110 which could accommodate any one or a plurality of different tester extension modules adapted for different types and size of lighting fixtures. In certain embodiments, a plurality of such tester extension modules can be provided with sizes ranging from the smallest specialty light fixtures, to the largest commercial light fixtures. Tester extension modules can be readily developed to accommodate all fixtures designed for all types of light bulbs and bases.

The tester devices preferably include a power source. In various embodiments, the power may be provided by AC or DC. Preferably the power source is DC and comprises one or more batteries, which may be rechargeable via a charger of suitable voltage, including a USB or micro-USB charger, a solar adapter, or inductive charging devices. The device in some embodiments may be powered directly via a connection to a power source (e.g. via AC or AC to DC conversion).

In certain embodiments the device comprises an audio output such as a 'audio out port' (e.g. for headphones or ear buds), or an on-board speaker. In such embodiments, as described in more detail below, the device may be capable of receiving audible results of testing, diagnoses, warnings (e.g. danger, open circuit, hot wire, or the like), diagnostic information, or instructions via audio or multimedia (in combination with e.g. an on-board display screen). Audio output may also be transmitted wirelessly to a speaker capable of receiving wireless audio, or to a computer such as a hand-held device.

With further reference to FIG. 1, a testing tool or device 100 as disclosed herein for testing lighting fixtures for electrical safety. As shown the device is about to be connected to a lighting fixture 102 by screwing threads (not shown) of modular tester extension 120 in light socket 105. Selector switch 160 is shown in the position to determine if the wiring is correct. Ground wire 170 is attached via alligator clip 174 to a grounded source such as screw 104 on light fixture 102. Indicator lights 130 will display the status of the light fixture and will inform the user as to whether the light fixture has been wired properly including a proper ground. In contrast, typical inspection (e.g. turning on the light at the switch, such as might be done during a routine home inspection) will not uncover whether the fixture has been wired correctly.

As can be seen in FIG. 1, light fixture 102 features 3 sockets 105 to accommodate light bulbs. Each socket 105 may be checked separately to reveal any defective socket(s) in the fixture 102. The device 100 depicted includes an optional display screen 140, however other embodiments may not include such a screen. Alternative, the data and information may be transmitted wirelessly, e.g. via the antenna 180, to the user's hand-held device such as a smartphone. The user can see all of the pertinent information via the screen on the smartphone, preferably through the use of a custom app or program installed on the user's phone and/or other computer.

In various embodiments, the tool may provide instructions for testing or diagnosing the light fixture via an on-screen display or via audible instructions, or a combination thereof. This mode of operation is reminiscent of an AED (automated external defibrillator) device which provides audible instructions for each step of the procedure of checking and defibrillating a person who has a cardiac event that can be helped via the AED device. The inventive electrical testing device can effectively provide instructions to the user such as "Turn off the light switch" "Remove a light bulb" "Position the tester device into the socket where the bulb was removed" "Connect the ground wire to a grounded surface" "Keep your hands clear" "Testing—Please Wait" "Warning: Hot Wire!" and so forth. It is anticipated that by making the device more user-friendly and less intimidating and confusing, more people will undertake the use of the device rather than ignoring a potential electrical problem. As a result of increased use, electrical safety will be increased.

Alternatively, the computer may provide the instructions to make the testing device more user friendly. In one embodiment the computer provides either wirelessly to the tool or via the screen on the computer (e.g. a handheld smartphone or tablet) useful information to the user of the testing tool. Preferably the information comprises one or more of instructions for operating the testing tool, instructions for testing the safety of an electrical component, analysis of a test performed with the testing tool, instructions for preventing or repairing an electrical safety issue identified with the testing tool, a listing of local repair services, or a listing of parts, tools, and/or supplies, or providers of parts, tools, and/or supplies for preventing or repairing an electrical safety issue.

The information may be in any form including test or audio, or even multimedia. The listings of local repair services or parts, tools, and/or supplies or providers thereof may comprise paid listings, advertisements, recommendations from other users of the testing tool, and the like. In some embodiments the app can display a 'click to dial' phone number or other contact information on e.g. a smartphone so that the user can conveniently contact a professional for help, schedule the professional to do required preventative or repair work, or check price and availability of e.g. parts or supplies.

In a second aspect, the disclosure provides testing tools for testing for electrical safety comprising an electrical testing tool with circuitry for communicating wirelessly with a computer. In various embodiments, the testing tool may comprise a device for testing electrical safety of a light fixture, a clamp meter, a receptacle tester, a multimeter, a contact or noncontact voltage detector, a continuity tester, an arc circuit tester, a ground resistance tester, a phase meter, a watt meter, insulation resistance tester/megohmmeter, or the like.

The testing tools are generally adapted to communicate wirelessly with a computer, preferably a hand-held computer such as a smart-phone, smart watch/wrist PDA, or a tablet.

The testing tools may comprise one or more of a display screen for providing visual information, a selector for selecting one or more testing functions, one or more indicator lights, an antenna for facilitating or improving wireless communication, a signal booster or amplifier for increasing the power and/or range of wireless communication, and/or an audio output for playing audio signals (such as tones, synthesized or recorded voices). The tools may further be adapted to receive one or more ground wires for attaching to a grounded object during electrical testing, or one or more other wires useful during other electrical testing. The wires may contain any of a plurality of plugs, clips, probes, or the like for making electrical contact with different electric components, receptacles or the like.

The testing tool in certain embodiments communicates with or works in conjunction with a remote program or app installed e.g. on a user's hand-held device, such as a smartphone or tablet computer. The app generally permits the computer and the testing tool to communicate and share data. For example, the electrical testing tool may wirelessly transmit testing results to the computer for storage or analysis, and the computing device may send information to the user of the testing tool, or to another person (such as a professional electrician, a building maintenance person, or a supervisor).

The app preferably comprises programming instructions at least to permit the computing device to readily receive status updates from the testing tool without any action by the user. The app is generally capable of diagnosing and storing the results of testing with the tool. The computer application may also provide diagnostic information to the tool for the benefit of the user. For example, if based on the testing performed, a short is detected, or a wire is determined to have too great a load on it, suitable warning or other information can be communicated.

The app may include additional functions as required to receive a variety of specific inputs (such as unique identification of the user or the location being tested, the type of testing being conducted), and may store the inputs along with test results (e.g. in a database) for future reference or comparisons. The app may further provide step-by-step instructions for testing, diagnosing, or repairing common electrical problems. Thus, the app in certain embodiments includes a library of operational instructions for the tools, testing instructions for a plurality of electrical components commonly found in residential or commercial electrical systems, corrective instructions to correct various electrical safety situations, and the like. The corrective instructions may include step-by-step instructions for maintenance and/or repair of common electrical problems.

In another embodiment, the instructions and other information can be communicated from the computer via the app to the testing tool. The instructions may include text, audio, or multimedia information. Alternatively, step-by-step directions may be offered or presented to the user of the tool. Instructions may include preliminary information that is vital to safety, for example the user may be instructed to turn off the relevant circuit breaker or power source e.g. at a electrical panel prior to beginning any repair or service. In addition the user may be instructed to properly lock or secure and mark the panel or break box to reduce the possibility of accidental or inadvertent turning on of the power to a line, receptacle, light, or the like that is being repaired In one embodiment the testing tools are modular testing tools comprising a body adapted for receiving one of a plurality of modular testing extensions. Modular extensions may be particularly adapted for testing electrical safety of various components such as light fixtures, receptacles, wiring or extension cords, and the like.

A module may be selected and attached to the body based on the testing a user wishes to perform. The modules can conveniently be removed or attached by the user, preferably without the use of tools.

As with other testing tools described herein, the body further comprises a power source (preferably a rechargeable source, e.g. a battery) as well as circuitry for testing various aspects of electrical safety (such as identifying open circuits, faults, voltage/current, correct electrical status such as ground, neutral, or hot). In various embodiments, the body also comprises the circuitry for wireless communication with a computer (e.g. a hand-held device, portable computer, or even a remote computer). The body may further comprise or have attached thereto one or more of a display screen, an audio output (e.g. a speaker or earphone/headset jack), and/or an antenna to assist with wireless communication. In one embodiment the body comprises one or more additional data ports or communication ports such as a USB or microUSB port. In addition, the body may comprise a power-in connection for powering the device from an external power supply or for charging a rechargeable internal battery. A signal amplifier or booster for boosting the power and/or range of a wireless communication signal may also be included within or attached to the body.

Preferably the testing tool comprises a plurality of indicator lights, such as low power lights, LEDs or the like which can indicate the status of the tool and/or the results of the testing for a given component.

The modular body is adapted to receive any of a plurality of different testing tools, which may be attached as described above.

Figure 2:
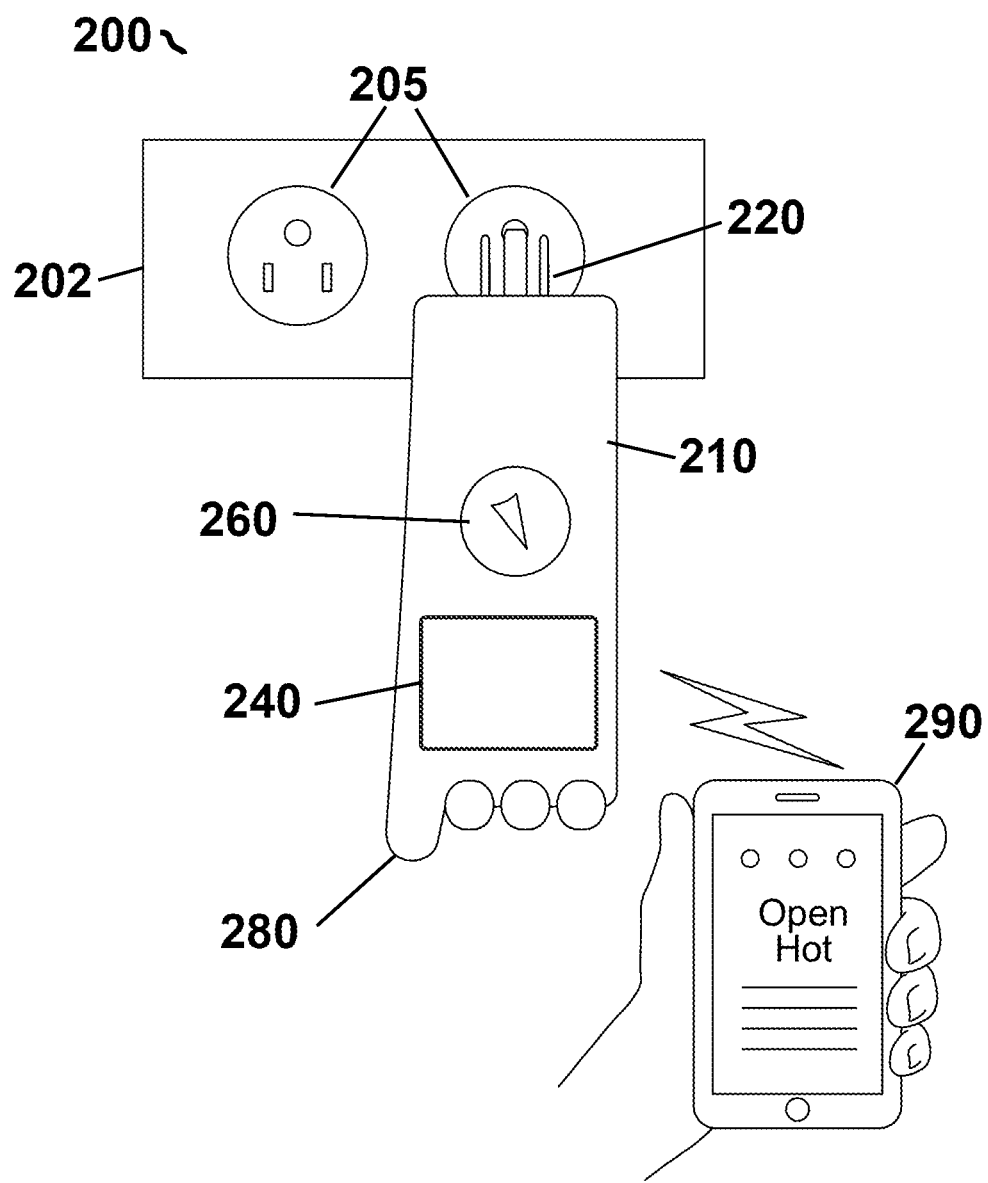
FIG. 2 is an illustration of an embodiment for testing sockets or receptacles.

With further reference to the figures, FIG. 2 depicts an embodiment of a testing tool 200 for testing the proper wiring and present safety of an electrical receptacle/socket 205 in an outlet 202 such as a three-prong receptacle/socket 205. The tool body 210 comprises the main electronic components (not shown) of the electrical testing tool and having attached thereto a receptacle/socket tester 220 adapted for testing the safety of electrical sockets. A plurality of such receptacle/socket testers 220 would be available to the end user such that the proper tester would only fit into the socket for which it is intended. The receptacle/socket tester 220 is in electrical communication with the base 210. The receptacle/socket tester 220 is at the bottom of the base of the testing tool 200 in the embodiment shown, however the receptacle/socket tester 220 or other tools may be connected to the bottom of the base 210 in other embodiments. The selector 260 allows the user to select the test desired and receptacle/socket tester 220 will identify if the ground wire is properly installed and also whether the socket is 'hot', 'open', etc. Such information can be displayed on the screen 240. The tester 220 is in communication with e.g. handheld computer 290 preferably via an antenna 280. The information/results may also be displayed and/or stored on the handheld computer 290.

Figure 3:
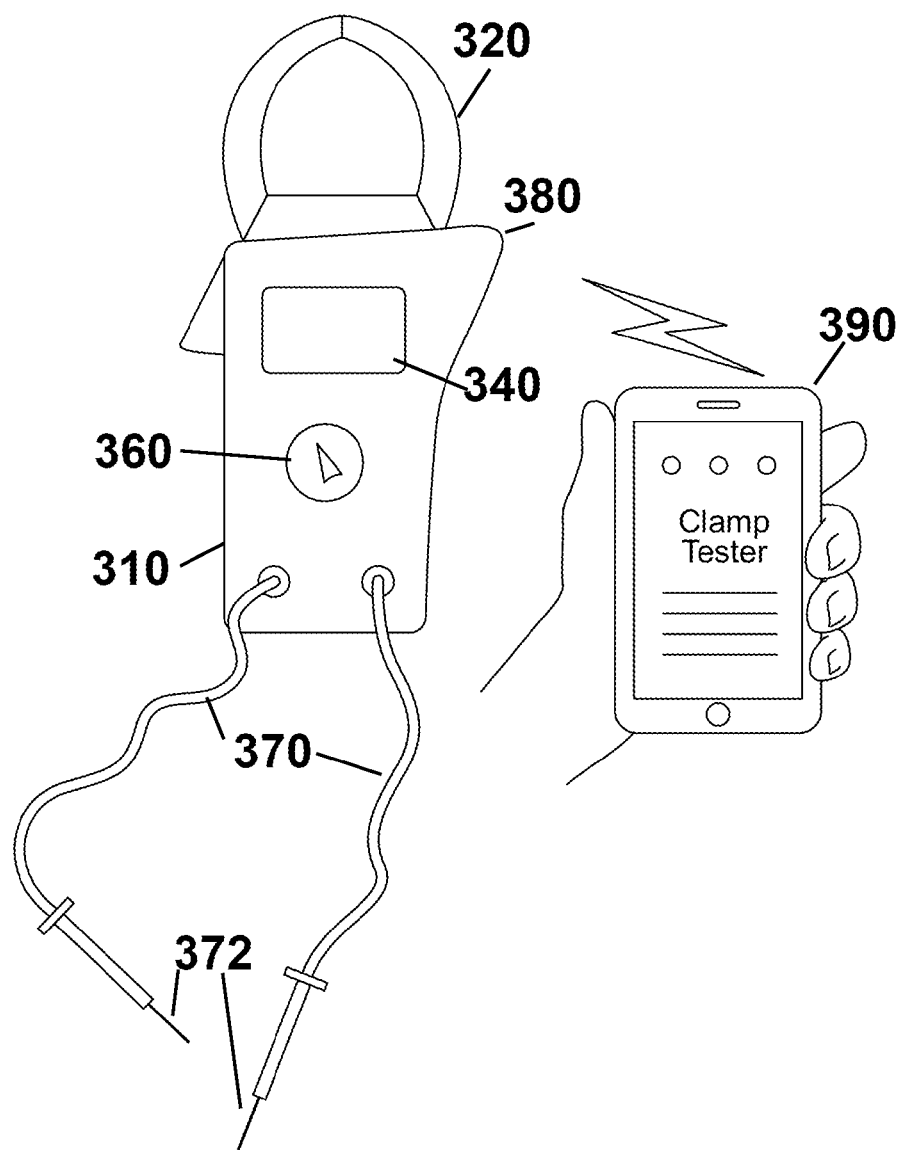
FIG. 3 depicts a front view of an embodiment of a testing tool for electrical systems with a clamp tester extension.

With further reference to the figures, FIG. 3 depicts an embodiment of a testing tool 300 for with a clamp tester attached.

The tool 300 features a base or body 310 comprising the main electronic components (not shown) of the electrical testing tool and having attached thereto a clamp tester 320 adapted for testing the safety of wires and the like. The clamp tester is in electrical communication with the base. The clamp tester is at the top of the base of the testing tool in the embodiment shown, however the clamp tester or other tools may be connected to the bottom of the base in other embodiments.

Clamp tester 320 as depicted features a larger clamp for attaching to a wire or other electrical component. As shown, the device 300 includes an optional display screen 340 adapted to display information to increase the convenience of using of the device or to enhance the user experience (e.g. by displaying useful or instructive to the user thereof). The embodiment depicted lacks optional indicator lights (such as LEDs or other low power light sources).

Also shown in the embodiment depicted includes selector 360 which is present as a selector knob. As with the prior aspect(s) of this disclosure, the selector may comprise knobs, buttons, switches, or the like or any combination thereof. Wires 370 are also attached and in electrical communication with the base 310 and/or the clamp module 320 as required. The wires 370 may be removable in various embodiments, or may be hardwired to the base or body 310. The distal end 372 of the wires 370 features probe or plugs 374, but may include an alligator clip or other useful attachment(s).

As with the prior aspect, the device 300 is adapted for communicating wirelessly with a handheld computer 390 and has circuitry sufficient for wireless communication including antenna 380. Ports for wired connections such as USB, micro-USB, or other communication ports may be included.

The clamp tester 320 or other tester extensions may be modular in nature. The device is adapted to receive any of a plurality of testing extension modules. Modules plug can into the device base 310 which can accommodate any one of a plurality of different tester extension modules adapted for different types and size of lighting fixtures, receptacles, wires, etc. In certain embodiments, testing modules comprise a module for testing electrical safety of a light fixture, a clamp meter, a receptacle tester, a circuit breaker finder, a multimeter, a contact or noncontact voltage detector, a continuity tester, an arc circuit tester, a ground resistance tester, a phase meter, a watt meter, insulation resistance tester/megohmmeter, or the like.

The device preferably includes a power source such as one or more batteries, which may be rechargeable via a charger of suitable voltage, including a USB or micro-USB charger, a solar adapter, or inductive charging devices.

In certain embodiments the device comprises an audio output such as a audio out port (e.g. for headphones or ear buds), or an on-board speaker. In such embodiments, the device may be capable of providing audible results of testing, warnings (e.g. danger, open circuit, hot wire, or the like), diagnostic information, or instructions.

In another of its several aspects, the disclosure provides methods of testing for electrical safety. The methods generally comprise the steps of:
a) providing an electrical testing tool comprising
i) a tool for testing light fixtures comprising a body having attached thereto and being in electrical connection with a tester extension adapted for testing the electrical safety of at least one light fixture; at least one ground wire in electrical connection with the body and adapted for connecting to a suitable external ground source; one or more selectors for selecting one or testing functions, and an internal power source for powering at least the tool, wherein the testing extension has nonconductive structure complementary to the light fixture so that it can be positioned therein for testing the fixture, and a conductive contact positioned for establishing electrical contact with the light fixture; or
ii) a device for enhancing electrical safety comprising a testing tool for testing an electrical component, said tool having circuitry for wireless communication, an antenna for facilitating or improving wireless communication with at least one computer, an internal power source for powering at least the tool and the wireless communication, one or more selectors for selecting one or testing functions, and one or more of a display screen, an audio output, and at least one indicator light; said tool adapted to receive one or more ground wires for attaching to a grounded object during electrical testing, or one or more other wires useful during other electrical testing;
b) using the electrical testing tool to test one or more electrical components one or more times;
c) sending the test results wirelessly to a computer;
d) analyzing the test results for one or more electrical safety issues; and
e) taking preventive or corrective action based on the analysis to resolve or mitigate any electrical safety issues; thereby enhancing electrical safety.

In some embodiments the device of a(ii) above is modular. I.e. the device comprises a tool adapted for receiving any of a plurality of testing modules wherein the testing modules comprise a module for testing electrical safety of a light fixture, a clamp meter, a receptacle tester, a circuit breaker finder, a multimeter, a contact or noncontact voltage detector, a continuity tester, an arc circuit tester, a ground resistance tester, a phase meter, a watt meter, or an insulation resistance tester/megohmmeter.

The computer is preferably a hand-held computer that is a smartphone, smart watch, PDA, or tablet computer, and preferably has a program installed for enhancing communication or data exchange with the testing device.

Preferably, the tool further comprises a audio output such as a speaker or headphone jack and can provide instructions to a user for using the tool or device, or can receive information including step-by-step instructions from the computer. In certain embodiments, the computer can provide one or more of instructions for operating the testing tool, instructions for testing the safety of an electrical component, analysis of a test performed with the testing tool, instructions for preventing or repairing an electrical safety issue identified with the testing tool, a listing of local repair services, or a listing of parts or supplies for preventing or repairing an electrical safety issue.

The testing tool is preferably suited for testing of either AC or DC power, including AC to DC converters, chargers, and the like. There has been an explosion of various chargers, charging cords, charging devices, charging stations, and the like in the average residence or commercial building. These devices are often carried around, and subject to abuse while packed and unpacked. In addition numerous devices are often plugged in to one or more receptacles and in preferred embodiments hereof, the testing devices and the like disclosed herein are useful for testing those devices. Also, some receptacle now include USB charging 'ports' for plugging devices into more directly. These too can preferably be tested for electrical safety using the devices disclosed herein. Proper testing can assure that the consumers, the buildings, and the devices are protected.

Figure 4:
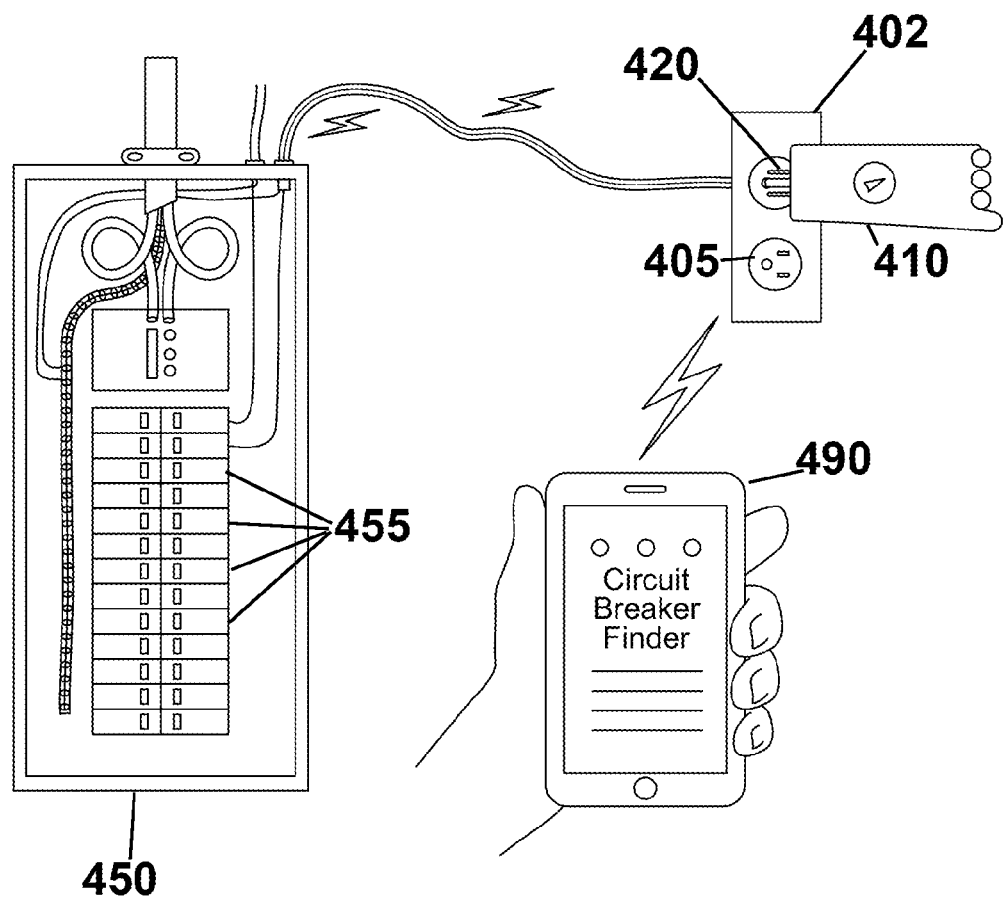

With further reference to the figures, FIG. 4 shows a method of using a modular testing device as a circuit break finder. In the embodiment shown, the device 400 (including a receptacle testing module 420) is plugged into receptacle 405 in outlet 402 that is remote from the electric panel 450 which in a separate location, e.g. it may be in another room, on a another floor, or the like. A person such as a DIYer may wish to replace, repair, or service the receptacle 405 and in order to do so must ensure the power is off by finding the circuit breaker that the receptacle 405 is connected to. With the receptacle tester 400 plugged into the receptacle 408, the DIYer can take a connected handheld device such as smartphone 490 to the electric panel 450. Electric panel 450 features a plurality of circuit breakers 455. To confirm/ensure the power is off to the receptacle, the DIYer can turn off the circuit breaker 455 believe to control the power to the receptacle 405. If the correct circuit breaker 455 has been selected and turned off, the receptacle testing device 400 will register that the power is off and will wirelessly communicate that to the smartphone 490. If the incorrect circuit breaker 455 has been turned off, the smartphone 490 (preferably via a suitable app) will continue to display that the receptacle 405 is hot. In the event that the circuit breakers 455 in the electric panel 450 are not labeled or the proper circuit breaker 455 is not know, the 'DIYer' (do-it yourselfer) can, e.g. sequentially turn off and on a plurality of breakers 455 until the correct breaker is turned off. The tester device 400 will wirelessly communicate with the smartphone 490 as soon as the power to the receptacle 408 is turned off. The handheld device/smartphone 490 can signal that the power is off and the receptacle 405 is safe to work on.

The smartphone 490 can be used to continue to monitor the line(s) providing power to the receptacle, for example by use of a clamp tester (not shown). Should the power be inadvertently switched back on during the repair, or in the absence of the DIYer, the smartphone 490 can immediately signal the line is hot.

Figure 5:
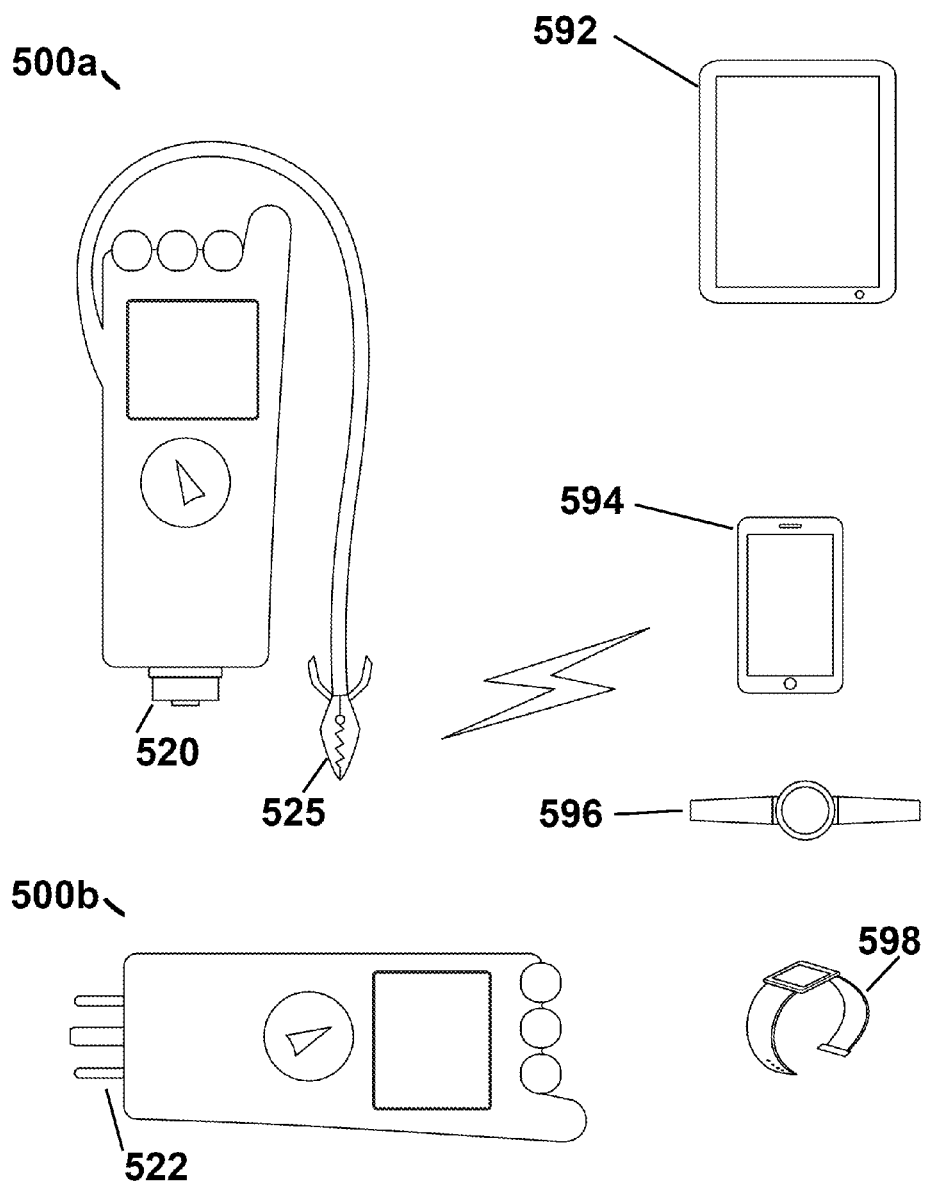
FIG. 5 depicts two exemplary modular testing devices fitted with different testing modules (e.g. light testing module, alligator clip module, and receptacle testing module.)

With still further reference to the figures, FIG. 5 depicts two modular testing devices 500a, 500b. The modular device 520a is equipped with light tester 520 module and alligator clip 525 module, whereas device 520b is fitted with a receptacle/socket testing module 522. Each of the devices can communicate wireless with a plurality of other devices including computers, handheld computers, and the depicted tablet computer 592, smartphone 594, headphones, 596, and wearable computer or smart watch 598. Each of the devices has the properties as described herein and above.

In yet another aspect, this disclosure provides methods of reducing financial risks associated with electrical safety for an insurer. The methods generally are methods of incentivizing safety by property owners and/or residents or tenants. The method typically comprise providing an incentive to an insured for using at an insured property, for a specified period on a specified frequency, an electrical testing tool comprising wireless communication circuitry for reporting electrical problems or faults wirelessly to a computer. The insured can themselves perform the testing or can of course hire a professional to do it for them, e.g. as part of a routine maintenance plan. The insurance company or an affiliate or agent then receives and collects data (directly or indirectly) from the use of the electrical testing tool by the insured during the specified period wherein the receiving and collecting are done using a computer in communication directly or indirectly with the electrical testing tool. Remaining steps generally include analyzing the collected data for one or more electrical safety issues for the insured property; and taking preventive or corrective action based on the analysis to resolve or mitigate the electrical safety issue. The skilled artisan will appreciate that by encouraging and monitoring such safety testing, the insurance company will be in a position to take steps to repair, prevent, service or otherwise mitigate any electrical issues, and by doing so will reduce financial risks associated with electrical safety.

In various embodiments, the methods further comprise the step of correlating a total amount of financial loss to the one or more electrical safety issues. In certain embodiments it may be advantageous to keep detailed records of actual losses for those insureds in the incentive program versus those not in the incentive program. Preferably, the total amount of financial loss can be apportioned at least to property loss, loss due to injury to a person, or loss due to loss of life.

In a presently preferred embodiment, provided are methods of reducing financial risks associated with electrical safety for an insurer comprising the steps of:

providing an incentive to an insured for using at an insured property, for a specified period on a specified frequency, an electrical testing tool comprising wireless communication circuitry for reporting electrical problems or faults wirelessly to a computer;

receiving and collecting data from the use of the electrical testing tool by the insured during the specified period wherein the receiving and collecting are done using a computer in communication directly or indirectly with the electrical testing tool;

analyzing the collected data for one or more electrical safety issues for the insured property; and taking preventive or corrective action based on the analysis to resolve or mitigate the electrical safety issue;

thereby reducing financial risks associated with electrical safety.

The methods can further comprise the step of correlating a total amount of financial loss to the one or more electrical safety issues. In one embodiment, the total amount of financial loss can be apportioned at least to property loss, loss due to injury to a person, or loss due to loss of life.

In a final aspect, methods of providing a marketing or advertising message related to electrical safety are disclosed. The methods comprise preparing an advertisement directly or indirectly related to electrical safety; and placing the advertisement for display or delivery to an audience in connection with a computer program or application used with an electrical testing tool comprising wireless communication circuitry for reporting electrical problems or faults wirelessly to a computer.

In some embodiments, the advertisement promotes the services of a professional electrician or repair person, or a service of potential interest to a person in need of electrical work. In other embodiments, the advertisement promotes parts, tools, or supplies related to electrical work, or parts, tools, or supplies of potential interest to a person needing parts, tools, or supplies for electrical work. In a preferred embodiment, there is a real-world transaction as a result of such marketing or advertising, i.e. a service is sold or the purchase of a part, tool, or supply is transacted. The app can include an e-commerce option that enables such purchases to made directly or indirectly via electronic means, including via a credit card or merchant account.

In a presently preferred embodiment, this disclosure includes methods of providing a marketing or advertising message related to electrical safety comprising the steps of
preparing an advertisement directly or indirectly related to electrical safety; and
placing the advertisement for display or delivery to an audience in connection with a computer program or application used with an electrical testing tool comprising wireless communication circuitry for reporting electrical problems or faults wirelessly to a computer.

In certain embodiments, the advertisement promotes the services of a professional electrician or repair person, or a service of potential interest to a person in need of electrical work.

In one embodiment, the advertisement promotes parts, tools, or supplies related to electrical work, or parts, tools, or supplies of potential interest to a person needing parts, tools, or supplies for electrical work.

Figure 6:
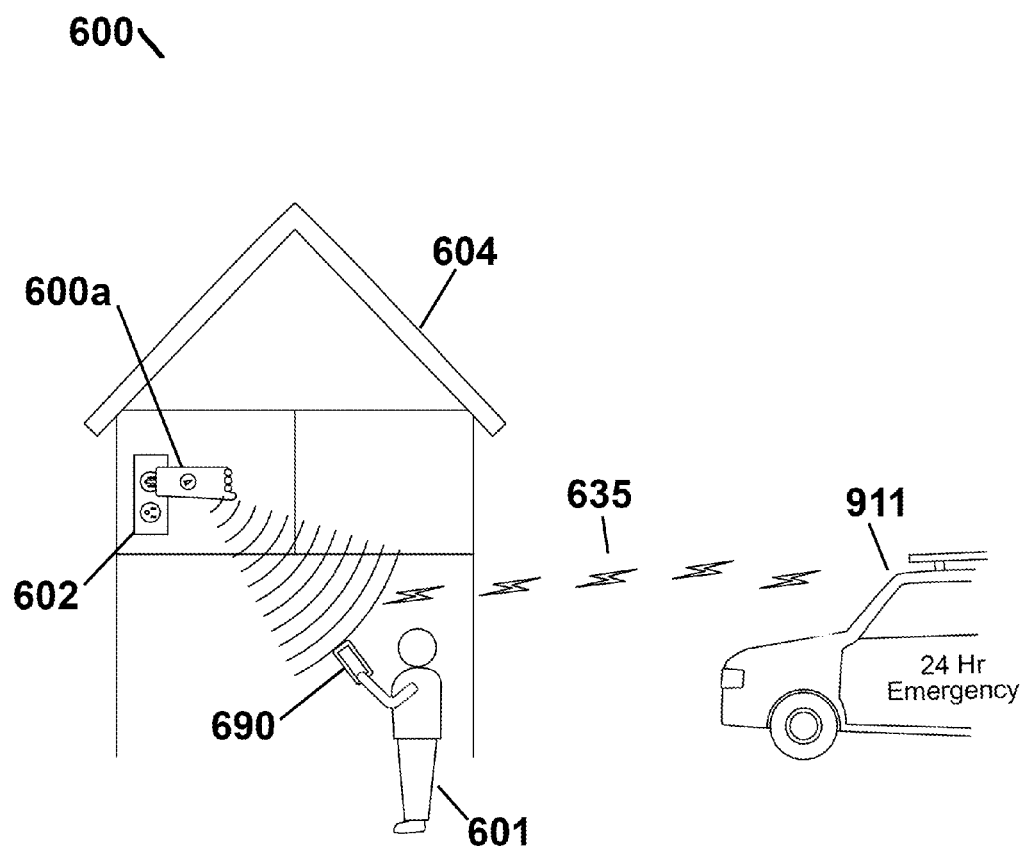
FIG. 6 shows how the device can provide access to an emergency technician. The user can use the device for testing. The device can notify the user of an emergency situation and can also notify a qualified emergency service that can address the problem. Alternatively the device may provide advertisements to the user, or data may be provided to an electrician, home monitoring service, or emergency service, which may contact the user to determine if service is required.

With further reference to the figures, FIG. 6 depicts a method 600 of use whereby an electrician or emergency repair service 911 communicates directly or indirectly with a user of modular tester 601 or similar tester as described herein, in order to determine if service is required. This can occur in a number of ways. For example user 601 owns a building 604 or is responsible for the maintenance thereof. The owner uses testing device 600a to determine the electrical safety of one or aspects of the building's electrical system such as receptacle 602. If the testing system 600a determines that a serious electrical fault is present (note the amount of "risk" as to what constitutes a serious fault may be user adjustable depending on factors such as skill level and the like). Upon detecting a serious situation the user 601 may receive a message in an app on handheld computer 690. Alternatively, or additionally, the message may come as an SMS message, an automated or manual call to a mobile phone number or the like. The user 601 may then be presented with a list of one or more electricians, or 24 hour service centers, or the like. The selection of such providers may be in connection with advertisers, or may be based on subscription services or the like to the providers. Alternatively, in some embodiments, the provider may be notified of the serious fault and may receive a notice including contact information for the user. The provider may then contact the user to offer or recommend services. Anther alternative is that users with various levels of fault may be targeted or retargeted with advertising, including special offers from one or more providers based on the nature, number or seriousness of problems that are detected with the system. In yet other embodiments, the users system may wireless contact an emergency repair service and automatically transmit the data associated with the fault. This would be particularly useful where for example a fire hazard existed, for example in a public building, a school, or an apartment building where a serious risk to life exists.

The scope of the invention is set forth in the claims appended hereto, subject, for example, to the limits of language. Although specific terms are employed to describe the invention, those terms are used in a generic and descriptive sense and not for purposes of limitation. Moreover, while certain presently preferred embodiments of the claimed invention have been described herein, those skilled in the art will appreciate that such embodiments are provided by way of example only. In view of the teachings provided herein, certain variations, modifications, and substitutions may occur to those skilled in the art. It is therefore to be understood that the invention may be practiced otherwise than as specifically described, and such ways of practicing the invention are either within the scope of the claims, or equivalent to that which is claimed, and do not depart from the scope and spirit of the invention as claimed.

I claim:

1. An electrical testing tool for testing light fixtures comprising a body having attached thereto and being in electrical connection with a tester extension adapted for testing the electrical safety of at least one light fixture; at least one ground wire in electrical connection with the body and adapted for connecting to a suitable external ground source; one or more selectors for selecting one or testing functions; an internal power source for powering at least the tool; and an audio output for providing instructions, wherein the testing extension has nonconductive structure complementary to the light fixture so that it can be positioned therein for testing the fixture, and a conductive contact positioned for establishing electrical contact with the light fixture.

2. The testing tool of claim 1 further comprising circuitry for wireless communication with a computer; wherein the circuitry is in electrically connection with and powered by the internal power source.

3. The testing tool of claim 2 further comprising an antenna for facilitating or improving the wireless communication.

4. The testing tool of claim 3 that communicates wirelessly with a handheld computer.

5. The testing tool of claim 4 wherein the handheld computer comprises an app for interacting with the testing tool.

6. The testing tool of claim 5 wherein the testing tool further comprises one or more of a display screen and an audio output, and the computer can provide one or more of instructions for operating the testing tool, instructions for testing the safety of an electrical component, analysis of a test performed with the testing tool, instructions for preventing or repairing an electrical safety issue identified with the testing tool, a listing of local repair services, or a listing of parts or supplies for preventing or repairing an electrical safety issue.

7. A device for enhancing electrical safety comprising a testing tool for testing an electrical component, said tool having circuitry for wireless communication, an antenna for facilitating or improving wireless communication with at least one computer, an internal power source for powering at least the tool and the wireless communication, one or more selectors for selecting one or testing functions, an audio output for providing instructions, and at least one indicator light.

8. The device of claim 7 wherein the computer is a hand-held computer that is a smartphone, smart watch, PDA, or tablet computer.

9. The device of claim 7 wherein the computer has a program installed for enhancing communication or data exchange with the device.

10. The device of claim 9 wherein the computer can provide one or more of instructions for operating the testing tool, instructions for testing the safety of an electrical component, analysis of a test performed with the testing tool, instructions for preventing or repairing an electrical safety issue identified with the testing tool, a listing of local repair services, or a listing of parts or supplies for preventing or repairing an electrical safety issue.

11. The device of claim 7 wherein the tool is adapted for receiving any of a plurality of testing modules wherein the testing modules comprise a module for testing electrical safety of a light fixture, a clamp meter, a receptacle tester, a circuit breaker finder, a multimeter, a contact or noncontact voltage detector, a continuity tester, an arc circuit tester, a ground resistance tester, a phase meter, a watt meter, or an insulation resistance tester/megohmmeter.

12. A method of enhancing electrical safety comprising the steps of:
   a) providing an electrical testing tool comprising
   b) using the electrical testing tool to test one or more electrical components one or more times;
   c) sending the test results wirelessly to a computer;
   d) analyzing the test results for one or more electrical safety issues; and
   e) taking preventive or corrective action based on the analysis to resolve or mitigate any electrical safety issues;
   thereby enhancing electrical safety;
   wherein the electrical device comprises:
      i) tool for testing light fixtures comprising a body having attached thereto and being in electrical connection with a tester extension adapted for testing the electrical safety of at least one light fixture; at least one ground wire in electrical connection with the body and adapted for connecting to a suitable external ground source; one or more selectors for selecting one or testing functions; an internal power source for powering at least the tool; and an audio output for providing instructions, wherein the testing extension has nonconductive structure complementary to the light fixture so that it can be positioned therein for testing the fixture, and a conductive contact positioned for establishing electrical contact with the light fixture; or
      ii) a testing tool for testing an electrical component, said tool having circuitry for wireless communication, an antenna for facilitating or improving wireless communication with at least one computer, an internal power source for powering at least the tool and the wireless communication, one or more selectors for selecting one or testing functions, an audio output for providing instructions, and at least one indicator light.

13. The method of claim 12 wherein the device b) comprises a tool adapted for receiving any of a plurality of testing modules wherein the testing modules comprise a module for testing electrical safety of a light fixture, a clamp meter, a receptacle tester, a circuit breaker finder, a multimeter, a contact or noncontact voltage detector, a continuity tester, an arc circuit tester, a ground resistance tester, a phase meter, a watt meter, insulation resistance tester/megohmmeter.

14. The method of claim 12 wherein the computer is a hand-held computer that is a smartphone, smart watch, PDA, or tablet computer.

15. The method of claim 12 wherein the computer has a program installed for enhancing communication or data exchange with the device.

16. The method of claim 15 wherein the computer can provide one or more of instructions for operating the testing tool, instructions for testing the safety of an electrical component, analysis of a test performed with the testing tool, instructions for preventing or repairing an electrical safety issue identified with the testing tool, a listing of local repair services, or a listing of parts or supplies for preventing or repairing an electrical safety issue.

17. A device for enhancing electrical safety comprising a tool for identifying a circuit breaker controlling electrical power to an electrical circuit, said tool having circuitry for wireless communication, an antenna for facilitating or improving wireless communication with at least one hand-held computer, an internal power source for powering at least the tool and the wireless communication, one or more indicator lights, and modules for connecting the circuit breaker to a light socket, an electrical wire, or a 2-prong, 3-prong, or GFI electrical outlet.

18. The device of claim 17 wherein the wireless communication to the handheld computer triggers an audio alert.

19. The device of claim 18 wherein the audio alert includes spoken information, instructions, or warnings.

* * * * *